(12) United States Patent
Wang et al.

(10) Patent No.: US 10,727,397 B1
(45) Date of Patent: Jul. 28, 2020

(54) MAGNETORESISTIVE RANDOM ACCESS MEMORY CELL

(71) Applicant: UNITED MICROELECTRONICS CORP., Hsin-Chu (TW)

(72) Inventors: Hui-Lin Wang, Taipei (TW); Yi-Wei Tseng, New Taipei (TW); Meng-Jun Wang, Taichung (TW); Chen-Yi Weng, New Taipei (TW); Chin-Yang Hsieh, Tainan (TW); Jing-Yin Jhang, Tainan (TW); Yu-Ping Wang, Taoyuan (TW); Chien-Ting Lin, Hsinchu (TW); Ying-Cheng Liu, Tainan (TW); Yi-An Shih, Changhua County (TW); Yi-Hui Lee, Taipei (TW); I-Ming Tseng, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/261,524

(22) Filed: Jan. 29, 2019

(30) Foreign Application Priority Data

Jan. 14, 2019 (CN) .......................... 2019 1 0030820

(51) Int. Cl.
| H01L 43/02 | (2006.01) |
| H01L 27/22 | (2006.01) |
| H01L 43/08 | (2006.01) |
| H01L 43/12 | (2006.01) |
| H01L 45/00 | (2006.01) |
| H01L 27/108 | (2006.01) |
| H01L 43/10 | (2006.01) |

(52) U.S. Cl.
CPC .......... *H01L 43/02* (2013.01); *H01L 27/1087* (2013.01); *H01L 27/222* (2013.01); *H01L 27/226* (2013.01); *H01L 27/228* (2013.01); *H01L 43/08* (2013.01); *H01L 43/10* (2013.01); *H01L 43/12* (2013.01); *H01L 45/1233* (2013.01); *H01L 45/1608* (2013.01); *H01L 45/1675* (2013.01)

(58) Field of Classification Search
CPC ......... H01L 43/02; H01L 43/08; H01L 43/10; H01L 43/12; H01L 27/222; H01L 27/226; H01L 27/228; H01L 27/1087; H01L 45/1233; H01L 45/1608; H01L 45/1675; H01L 45/12
USPC ... 257/427, 421, 422, 425, 4, 314, 295, 774, 257/E43.004, E43.006, E45.003, E29.323, 257/E21.001, E21.002, E21.665; 365/148, 158, 171, 185.07, 185.18; 438/3, 381, 382, 706, 709
See application file for complete search history.

(56) References Cited

U.S. PATENT DOCUMENTS 9,818,935 B2   11/2017   Chuang
10,181,558 B2 *  1/2019   Hsu .......................... H01L 43/08
(Continued)

*Primary Examiner* — Dao H Nguyen
(74) *Attorney, Agent, or Firm* — Winston Hsu

(57) ABSTRACT

A magneto-resistive random access memory (MRAM) cell includes a substrate having a dielectric layer disposed thereon, a conductive via disposed in the dielectric layer, and a cylindrical stack disposed on the conductive via. The cylindrical stack includes a bottom electrode, a magnetic tunneling junction (MTJ) layer on the bottom electrode, and a top electrode on the MTJ layer. A spacer layer is disposed on a sidewall of the cylindrical stack. The top electrode protrudes from a top surface of the spacer layer.

16 Claims, 2 Drawing Sheets

(56) References Cited

U.S. PATENT DOCUMENTS

| | | | |
|---|---|---|---|
| 10,355,198 B2* | 7/2019 | Liao | H01L 27/228 |
| 10,454,021 B2* | 10/2019 | Sung | H01L 43/08 |
| 10,497,860 B2* | 12/2019 | Chen | H01L 43/12 |
| 2011/0198715 A1* | 8/2011 | Matsuoka | H01L 27/228 257/421 |
| 2011/0235217 A1* | 9/2011 | Chen | H01L 43/08 360/324.2 |
| 2013/0171743 A1* | 7/2013 | Lee | H01L 43/12 438/3 |
| 2013/0267042 A1* | 10/2013 | Satoh | H01L 27/222 438/3 |
| 2014/0210103 A1* | 7/2014 | Satoh | H01L 45/04 257/774 |
| 2019/0165258 A1* | 5/2019 | Peng | H01L 43/12 |

* cited by examiner

MAGNETORESISTIVE RANDOM ACCESS MEMORY CELL

BACKGROUND OF THE INVENTION

1. Field of the Invention

The present invention relates to the field of semiconductor technology, and more particularly to a spin-transfer torque magnetoresistive random access memory (STT-MRAM) cell structure.

2. Description of the Prior Art

As known in the art, spin-transfer torque magnetoresistive random access memory (STT-MRAM) is a non-volatile memory that has come under much scrutiny recently in the industry, which has several advantages over the conventional magnetoresistive random access memory. For example, these advantages include higher endurance, lower-power consumption, and faster operating speed.

In a magneto-tunnel junction (MTJ) including two ferromagnetic layers having a thin insulating layer therebetween, the tunnel resistance varies depending on the relative directions of magnetization of the two ferromagnetic layers. A magnetoresistive random access memory may be a semiconductor device where magnetic elements (MTJ elements) having MTJs utilizing a tunnel magneto resistance (TMR) effect are arranged in a matrix form as a memory cell.

SUMMARY OF THE INVENTION

The present invention provides an improved spin-transfer torque magnetoresistive random access memory (STT-MRAM) cell structure.

An aspect of the invention provides a magnetoresistive random access memory (MRAM) cell, comprising: a substrate having a dielectric layer thereon; a conductive via hole disposed in the dielectric layer; and a cylindrical stack disposed on the conductive via. The cylindrical stack includes a bottom electrode, a magnetic tunneling junction (MTJ) layer disposed on the bottom electrode, and a top electrode disposed on the MTJ layer. A spacer layer is disposed on the sidewall of the cylindrical stack. The top electrode protrudes from a top surface of the spacer layer.

According to an embodiment of the invention, the top electrode comprises a ruthenium (Ru) layer and a tantalum (Ta) layer on the Ru layer. The top electrode has a conical shape with its vertex pointing upwardly above the top surface of the spacer layer.

According to another embodiment of the present invention, the top electrode comprises a ruthenium (Ru) layer and a titanium nitride (TiN) layer on the Ru layer. The top electrode includes an upwardly convex curved top surface profile.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 1:
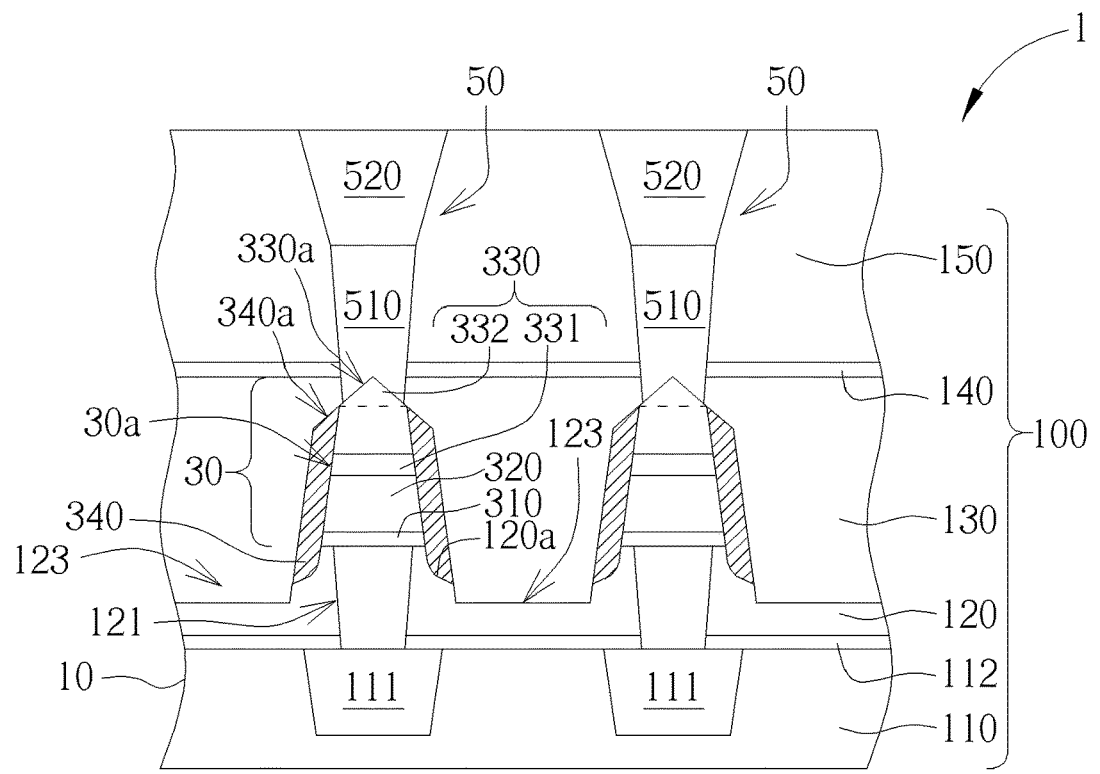
FIG. 1 is a cross-sectional view of a magnetoresistive random access memory (MRAM) cell according to an embodiment of the invention.

Please refer to FIG. 1, which is a cross-sectional view of a magnetoresistive random access memory (MRAM) cell according to an embodiment of the invention. As shown in FIG. 1, the MRAM cell 1 comprises a substrate 10, such as a silicon substrate, having a dielectric layer stack 100 thereon, including, but not limited to, a dielectric layer 110, a stop layer 112, and a dielectric layer 120, an interlayer dielectric (ILD) layer 130, a stop layer 140, and an interlayer dielectric layer 150. For example, the dielectric layer 110 may be an ultra low-k material layer, and the dielectric layer 120 may be a silicon oxide layer, but is not limited thereto. For example, the stop layers 112, 140 may be a nitrogen-doped silicon carbide layer or a silicon nitride layer, but are not limited thereto. For example, the stop layer 140 is a nitrogen-doped silicon carbide layer.

According to an embodiment of the invention, a lower metal interconnect structure 111 may be formed in the dielectric layer 110. A conductive via 121 is provided in the dielectric layer 120. According to an embodiment of the invention, the lower metal interconnect structure 111 may be a copper wire, and the conductive via 121 may be a tungsten metal via, but is not limited thereto.

According to an embodiment of the invention, a cylindrical stack 30 is disposed on the conductive via 121. According to an embodiment of the invention, the cylindrical stack 30 includes a bottom electrode 310, a magnetic tunneling junction (MTJ) layer 320 disposed on the bottom electrode 310, and a top electrode 330 disposed on the MTJ layer 320. According to an embodiment of the invention, the width of the bottom electrode 310 is greater than the width (or diameter) of the conductive via 121. The bottom electrode 310 may include, for example, but not limited to, tantalum (Ta), platinum (Pt), copper (Cu), gold (Au), aluminum (Al), or the like. According to an embodiment of the invention, the sidewall 30a of the cylindrical stack 30 tapers from the bottom electrode 310 to the top electrode 330.

The multi-layer structure of the MTJ layer 320 is well known, and the details thereof will not be described herein. For example, the MTJ layer 320 may include a fixed layer, a free layer, and a capping layer, but is not limited thereto. The fixed layer may be composed of an antiferromagnetic (AFM) material such as iron manganese (FeMn), platinum manganese (PtMn), lanthanum manganese (IrMn), nickel oxide (NiO), etc., to fix or limit the direction of the magnetic moment of the proximity layer. The free layer may be composed of a ferromagnetic material such as iron, cobalt, nickel, or an alloy thereof such as cobalt-iron-boron (CoFeB), but is not limited thereto.

According to an embodiment of the invention, the top electrode 330 comprises a ruthenium (Ru) layer 331 and a tantalum (Ta) layer 332 disposed on the base ruthenium layer 331.

According to an embodiment of the invention, the MRAM cell 1 further comprises a spacer layer 340 disposed on the sidewall 30a of the cylindrical stack 30. According to an embodiment of the invention, the spacer layer 340 may be a silicon nitride spacer layer. In accordance with an embodiment of the invention, the spacer layer 340 has a thickness of between about 300 angstroms and about 600 angstroms. In accordance with an embodiment of the invention, the top electrode 330 protrudes from the top surface 340a of the spacer layer 340.

According to an embodiment of the invention, the dielectric layer 120 surrounds the conductive via 121 and has a tapered outer surface 120a. In accordance with an embodiment of the invention, the spacer layer 340 extends to the tapered outer surface 120a of the dielectric layer 120. According to an embodiment of the invention, the bottom electrode 310 is in direct contact with the conductive via 121 and the dielectric layer 120 surrounding the conductive via 121. In accordance with an embodiment of the invention, the top electrode 330 has a conical shape 330a with its vertex pointing upwardly above the top surface 340a of the spacer layer 340.

According to an embodiment of the invention, the interlayer dielectric layer 130 covers the dielectric layer 120, the cylindrical stack 30, and the spacer layer 340. The stop layer 140 is disposed on the interlayer dielectric layer 130. The interlayer dielectric layer 150 is disposed on the stop layer 140. A dual damascene metal interconnect structure 50 is embedded in the interlayer dielectric layer 150, the stop layer 140, and the interlayer dielectric layer 130. The dual damascene metal interconnect structure 50 includes a via plug 510 and a metal trace 520 formed integrally with the via plug 510. The dual damascene metal interconnect structure 50 can be formed by a copper dual damascene process. The copper dual damascene process is well known, so the details are not described herein.

According to an embodiment of the invention, the via plug 510 is electrically coupled to the top electrode 330. In accordance with an embodiment of the present invention, the via plug 510 completely covers the portion with conical shape 330a of the top electrode 330 and may cover a portion of the top surface 340a of the spacer layer 340.

Another feature in FIG. 1 is that the spacer layer 340 is etched and formed only on the sidewall 30a of the cylindrical stack 30 and extends slightly downward to the upwardly tapered outer surface 120a of the dielectric layer 120. During the anisotropic dry etching of the spacer layer 340, a recess structure 123 is formed on the dielectric layer 120.

Figure 2:
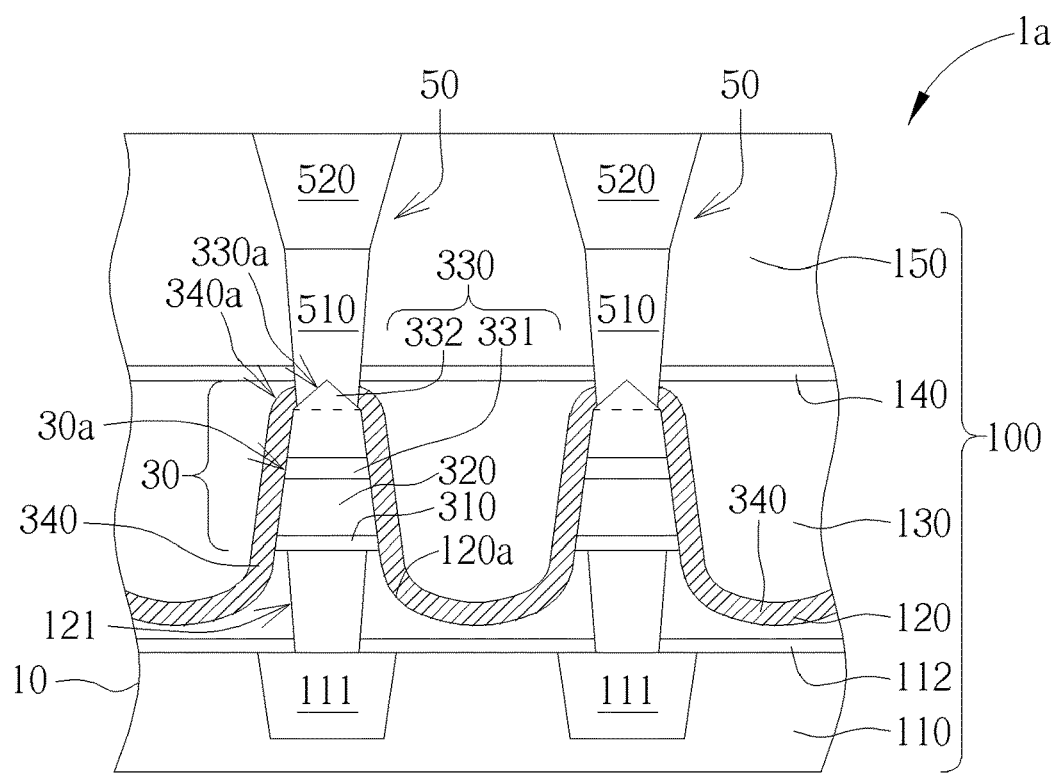
FIG. 2 is a cross-sectional view of a MRAM cell according to another embodiment of the present invention.

FIG. 2 is a cross-sectional view of a MRAM cell according to another embodiment of the present invention, wherein the same regions, material layers or elements are still denoted by the same numeral numbers.

As shown in FIG. 2, the MRAM cell 1a has substantially the same structure as the MRAM cell 1 of FIG. 1 except that the spacer layer 340 of the MRAM cell 1a completely covers the surface of the dielectric layer 120 and the spacer layer 340 is not etched, and thus the recess structure 123 on the dielectric layer 120 in FIG. 1 is not formed. In addition, the via plug 510 penetrates through the spacer layer 340 to be electrically coupled to a portion of the portion with conical shape 330a of the top electrode 330.

Figure 3:
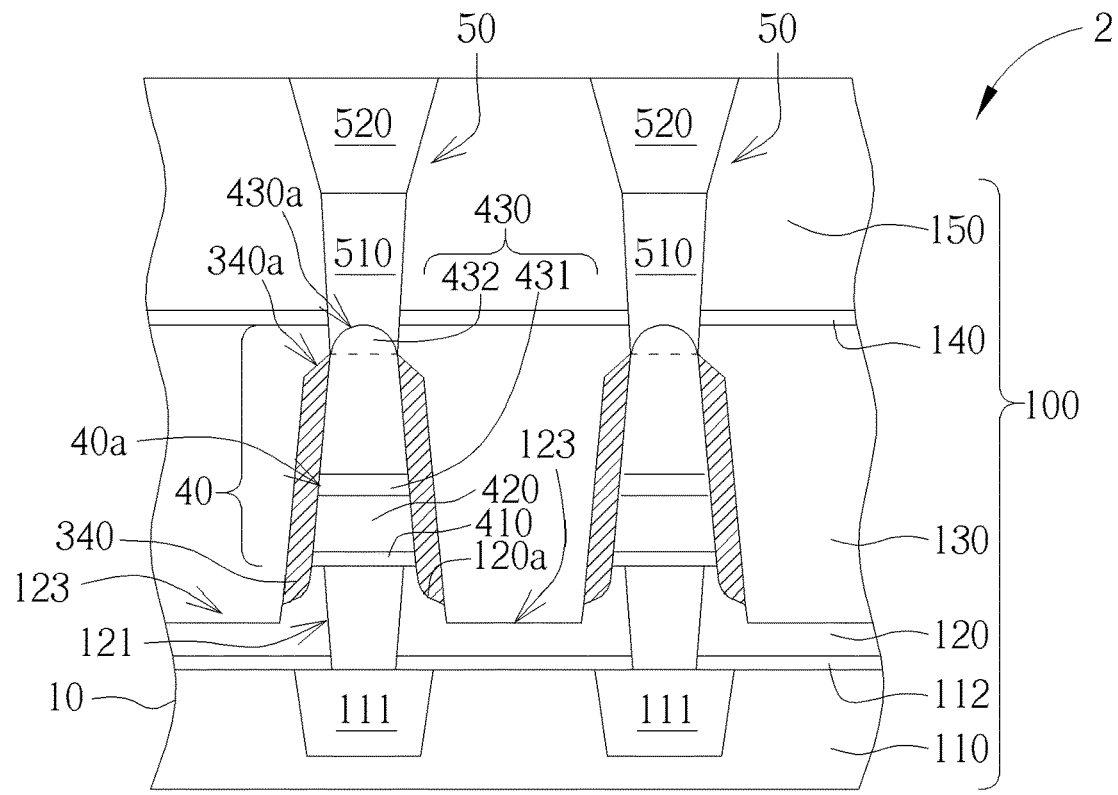
FIG. 3 is a cross-sectional view of a MRAM cell according to still another embodiment of the present invention.

FIG. 3 is a cross-sectional view of a MRAM cell according to still another embodiment of the present invention, wherein the same regions, material layers or elements are still denoted by the same numeral numbers.

As shown in FIG. 3, the MRAM cell 2 has substantially the same structure as the MRAM cell 1 of FIG. 1 except that the top electrodes of the cylindrical stack are different. The cylindrical stack 40 of the MRAM cell 2 includes a bottom electrode 410, a magnetic tunneling junction (MTJ) layer 420 disposed on the bottom electrode 410, and a top electrode 430 disposed on the MTJ layer 420. According to an embodiment of the invention, the top electrode 430 comprises a ruthenium (Ru) layer 431 and a titanium nitride (TiN) metal layer 432 disposed on the Ru layer 431.

According to an embodiment of the invention, likewise, the MRAM cell 2 comprises the spacer layer 340 that is disposed on the sidewall 40a of the cylindrical stack 40. According to an embodiment of the invention, the spacer layer 340 may be a silicon nitride spacer layer. In accordance with an embodiment of the invention, the spacer layer 340 has a thickness of between about 300 angstroms and about 600 angstroms. In accordance with an embodiment of the invention, the top electrode 430 protrudes from the top surface 340a of the spacer layer 340.

According to an embodiment of the invention, likewise, the dielectric layer 120 surrounds the conductive via 121 and has a tapered outer surface 120a. In accordance with an embodiment of the invention, the spacer layer 340 extends to the tapered outer surface 120a of the dielectric layer 120. According to an embodiment of the invention, the bottom electrode 410 directly contacts the conductive via 121 and the dielectric layer 120 surrounding the conductive via 121. In accordance with an embodiment of the invention, the top electrode 430 has an upwardly convex curved top surface profile 430a above the top surface 340a of the spacer layer 340.

Figure 4:
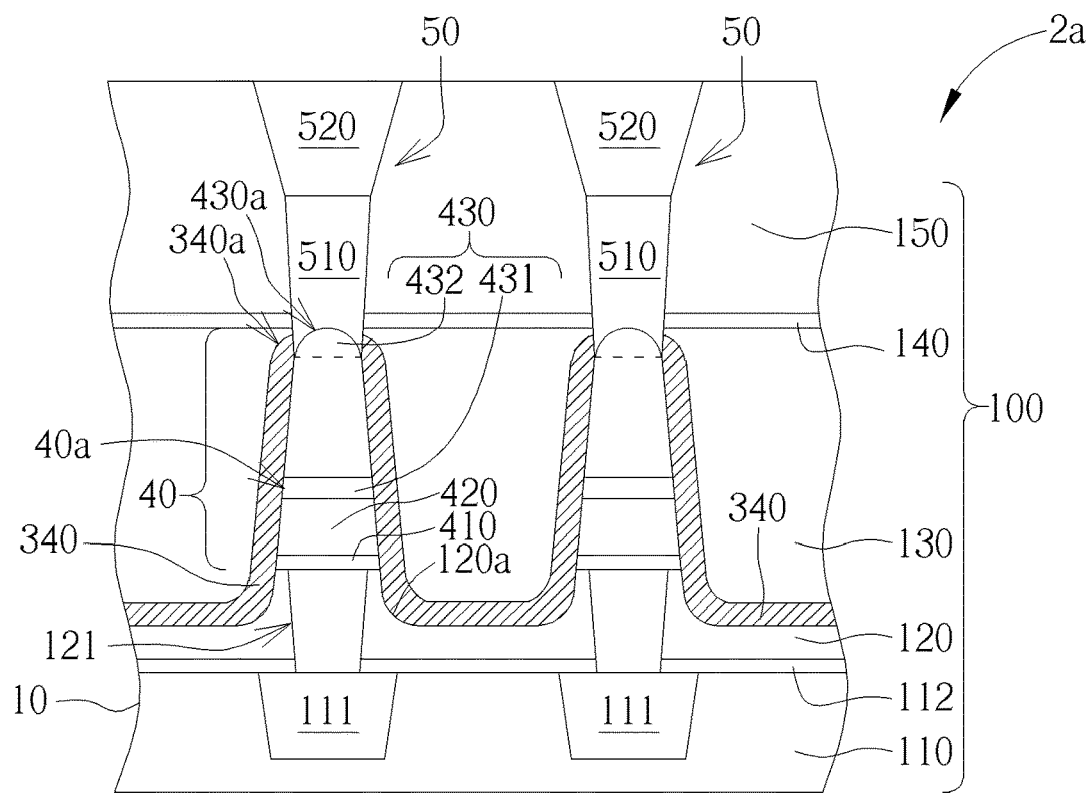
FIG. 4 is a cross-sectional view of a MRAM cell according to still another embodiment of the present invention.

FIG. 4 is a cross-sectional view of a MRAM cell according to still another embodiment of the present invention, wherein the same regions, material layers or elements are still denoted by the same numeral numbers.

As shown in FIG. 4, the MRAM cell 2a has substantially the same structure as the MRAM cell 2 of FIG. 3 except that the spacer layer 340 of the MRAM cell 2a completely covers the surface of the dielectric layer 120 and the spacer layer 340 is not etched, and thus the recess structure 123 on the dielectric layer 120 in FIG. 3 is not formed. In addition, the via plug 510 penetrates through the spacer layer 340 to be electrically coupled to the portion with the upwardly convex curved top surface profile 430a of the top electrode 430.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A magnetoresistive random access memory (MRAM) cell, comprising:
  a substrate having a dielectric layer disposed thereon;
  a conductive via disposed in the dielectric layer;
  a cylindrical stack disposed on the conductive via, the cylindrical stack comprising a bottom electrode, a magnetic tunneling junction (MTJ) layer on the bottom electrode, and a top electrode on the MTJ layer; and a spacer layer disposed on a sidewall of the cylindrical stack, wherein the top electrode protrudes from a top surface of the spacer layer, wherein the top electrode has a conical shape of a right cone with its vertex pointing upwardly above the top surface of the spacer layer, and a top surface of the conical shape is flat, and is coplanar with the top surface of the spacer layer.

2. The MRAM cell according to claim 1, wherein the top electrode comprises a ruthenium (Ru) layer and a tantalum (Ta) layer on the Ru layer.

3. The MRAM cell according to claim 1, wherein the sidewall of the cylindrical stack tapers from the bottom electrode to the top electrode.

4. The MRAM cell according to claim 1, wherein the top electrode comprises a ruthenium (Ru) layer and a titanium nitride (TiN) layer on the Ru layer.

5. The MRAM cell according to claim 1, wherein a width of the bottom electrode is greater than a width of the conductive via.

6. The MRAM cell according to claim 1, wherein the conductive via is a tungsten via.

7. The MRAM cell according to claim 1, wherein the dielectric layer surrounds the conductive via and has a tapered outer surface.

8. The MRAM cell according to claim 7, wherein the spacer layer extends to the tapered outer surface.

9. The MRAM cell according to claim 7, wherein the bottom electrode is in direct contact with the conductive via and the dielectric layer that surrounds the conductive via.

10. The MRAM cell according to claim 1, wherein the spacer layer is a silicon nitride spacer layer, and wherein the top surface of the spacer layer is entirely planar.

11. The MRAM cell according to claim 1, wherein the spacer layer has a thickness of about 300 angstroms to about 600 angstroms.

12. The MRAM cell according to claim 1, wherein the dielectric layer is a silicon oxide layer.

13. The MRAM cell according to claim 1 further comprising:
a first interlayer dielectric (ILD) layer covering the dielectric layer, the cylindrical stack, and the spacer layer;
a stop layer on the first ILD layer;
a second ILD layer on the stop layer; and
a dual damascene metal interconnect structure embedded in the second ILD layer, the stop layer, and the first ILD layer.

14. The MRAM cell according to claim 13, wherein the stop layer is a nitrogen-doped silicon carbide layer.

15. The MRAM cell according to claim 13, wherein the dual damascene metal interconnect structure comprises a via plug and metal trace integrally formed with the via plug.

16. The MRAM cell according to claim 13, wherein the via plug is electrically connected to the top electrode.

* * * * *